(12) United States Patent
Tajitsu

(10) Patent No.: US 9,105,833 B2
(45) Date of Patent: Aug. 11, 2015

(54) ACTUATOR AND METHOD FOR DRIVING ACTUATOR

(75) Inventor: Yoshiro Tajitsu, Suita (JP)

(73) Assignee: A SCHOOL CORPORATION KANSAI UNIVERSITY, Osaka (JP)

( * ) Notice: Subject to any disclaimer, the term of this patent is extended or adjusted under 35 U.S.C. 154(b) by 134 days.

(21) Appl. No.: 13/978,261

(22) PCT Filed: Dec. 27, 2011

(86) PCT No.: PCT/JP2011/080275
§ 371 (c)(1),
(2), (4) Date: Jul. 3, 2013

(87) PCT Pub. No.: WO2012/093623
PCT Pub. Date: Jul. 12, 2012

(65) Prior Publication Data
US 2013/0278180 A1 Oct. 24, 2013

(30) Foreign Application Priority Data

Jan. 7, 2011 (JP) .................... 2011-002113
Sep. 13, 2011 (JP) .................... 2011-199650

(51) Int. Cl.
*H01L 41/04* (2006.01)
*H01L 41/187* (2006.01)
*H02N 2/00* (2006.01)
*H02N 2/16* (2006.01)
(Continued)

(52) U.S. Cl.
CPC .......... *H01L 41/042* (2013.01); *H01L 41/1875* (2013.01); *H02N 2/0035* (2013.01); *H02N 2/163* (2013.01); *H01L 41/29* (2013.01); *H02N 2/14* (2013.01)

(58) Field of Classification Search
CPC .................................................... H01L 41/042
USPC ........................................... 318/116, 34, 558
See application file for complete search history.

(56) References Cited

U.S. PATENT DOCUMENTS 5,760,527 A * 6/1998 Ashizawa ..................... 310/317
6,469,417 B2 * 10/2002 Shibatani ................. 310/316.01
7,075,211 B1 * 7/2006 Ganor et al. .................. 310/317
(Continued)

FOREIGN PATENT DOCUMENTS

JP          2-17871        1/1990
JP          2722206        11/1997
(Continued)

OTHER PUBLICATIONS

Notification of Transmittal of Translation of the International Preliminary Report on Patentability issued Aug. 8, 2013 in corresponding International Application No. PCT/JP2011/080275.
(Continued)

*Primary Examiner* — David S Luo
(74) *Attorney, Agent, or Firm* — Wenderoth, Lind & Ponack, L.L.P.

(57) ABSTRACT

An actuator is provided which can be driven with a simple configuration and by simple control. The actuator comprises a thin film made of a shear piezoelectric material, a first electrode formed on a first main surface of the thin film, and a second electrode formed on a second main surface of the thin film. A driving force is generated on at least one end edge of the thin film by applying a predetermined AC voltage between the first electrode and the second electrode.

8 Claims, 7 Drawing Sheets

(51) Int. Cl.
*H01L 41/29* (2013.01)
*H02N 2/14* (2006.01)

(56) References Cited

U.S. PATENT DOCUMENTS

| | | | |
|---|---|---|---|
| 7,439,650 | B2 | 10/2008 | Sawada |
| 7,810,915 | B2 * | 10/2010 | Takabe et al. .................. 347/70 |
| 8,148,881 | B2 | 4/2012 | Yoneyama |
| 2007/0001547 | A1 | 1/2007 | Sawada |
| 2010/0194243 | A1 | 8/2010 | Yoneyama |

FOREIGN PATENT DOCUMENTS

| | | |
|---|---|---|
| JP | 2007-40967 | 2/2007 |
| JP | 2009-254058 | 10/2009 |
| JP | 2010-175521 | 8/2010 |
| JP | 2010-268630 | 11/2010 |

OTHER PUBLICATIONS

International Search Report (ISR) issued Apr. 17, 2012 in International (PCT) Application No. PCT/JP2011/080275.

Takeshi Morita et al., "A Cylindrical Micro Ultrasonic Motor Using PZT Thin Film Deposited by Single Process Hydrothermal Method", IEEE Transactions on Ultrasonics, Ferroelectrics, and Frequency Control, vol. 45, No. 5, pp. 1178-1187, Sep. 5, 1998.

* cited by examiner

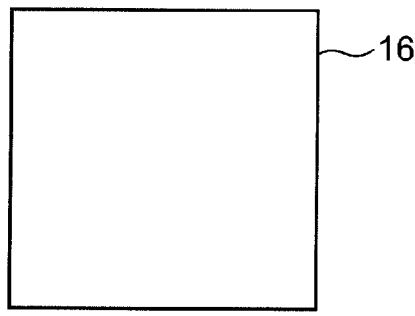
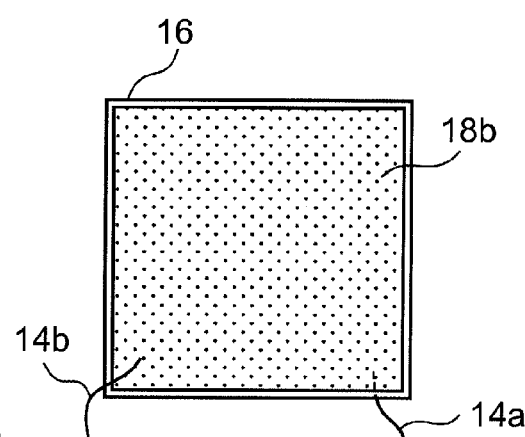
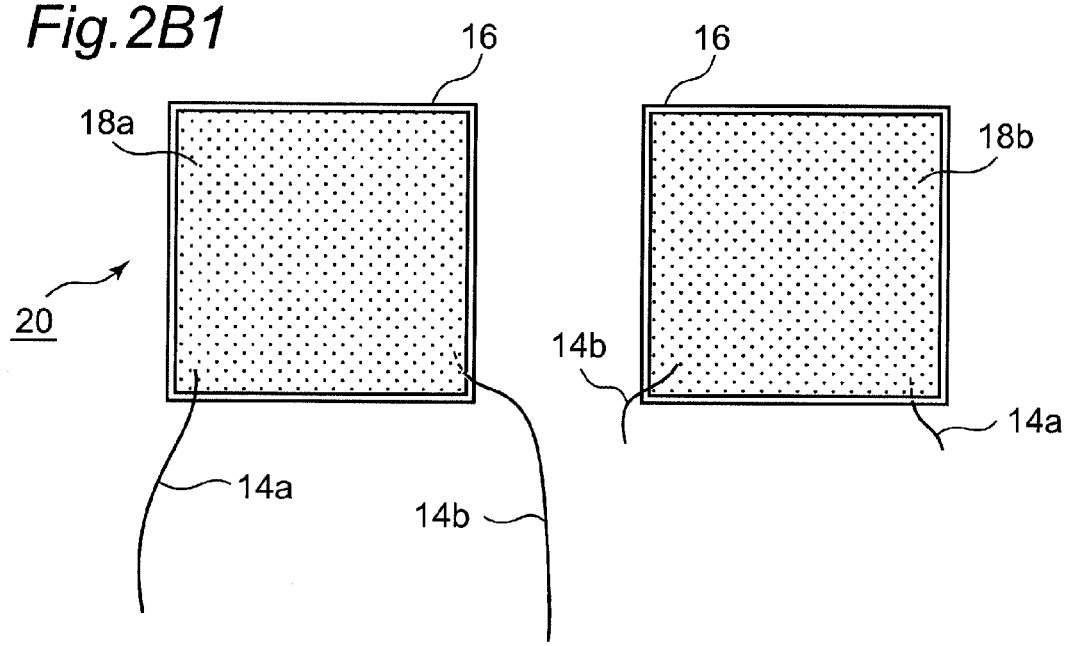
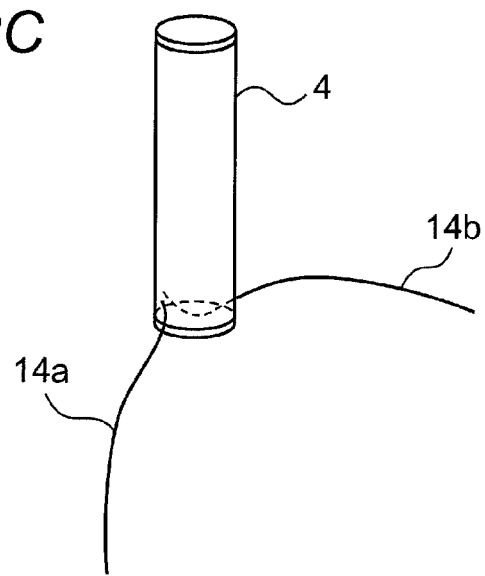

ACTUATOR AND METHOD FOR DRIVING ACTUATOR

TECHNICAL FIELD

The present invention relates to an actuator generating torque and driving force by voltage application, and a method for driving the actuator.

BACKGROUND ART

Recently, there has been desired to develop actuators for obtaining rotating operation and translating operation in a very small space. Such an actuator has been required to achieve further weight reduction.

FIGS. 7A to 7C illustrate a PZT tubular motor 50 developed by Tokyo University and IMRE (refer to Non-Patent Document 1). As illustrated in a plan view (FIG. 7C), a stator (PZT tube) 56 has four electrodes formed on an outer side surface thereof and polarized in a radial direction. When a sine voltage and a cosine voltage are applied as illustrated in FIG. 7C, a rotation flexure mode is excited (FIGS. 7A, 7B). FIG. 7A illustrates the tubular motor 50 in the case where the rotation flexure mode is excited, and FIG. 7E schematically illustrates operation in the rotation flexure mode. As illustrated in FIGS. 7A to 7C, two rotors 54a and 54b are capable of simultaneously rotating at two ends of the tubular motor 50, and the operation of the tubular motor 50 is very similar to that of an eccentric motor (see FIG. 7B).

PRIOR ART DOCUMENTS

Patent Document

Patent Document 1: Japanese Patent No. 2722206

Non-Patent Document

Non-Patent Document 1: Takeshi Morita, Minoru Kuribayashi Kurosawa, IEEE Transactions on Ultrasonics, Ferroelectrics, and Frequency Control, Vol. 45, No. 5, Sep. 1998, pp1178-1187.

DISCLOSURE OF INVENTION

Problems to be Solved by the Invention

The tubular motor 50 illustrated in FIGS. 7A to 7C must be provided with the four different electrodes, so that the electrode configuration becomes complicated. Moreover, the plurality of AC voltages (sine voltage, cosine voltage) which are different in phase from each other must be applied to the electrodes, so that the control of the voltages becomes complicated.

As a solution to these problems, Patent Document 1 discloses an ultrasonic drive device (rotary actuator) including a hollow cylindrical ceramic piezoelectric element having electrodes formed on inner and outer surfaces thereof. Herein, an AC voltage having a resonant frequency in a height direction of the ceramic piezoelectric element and an AC voltage having a resonant frequency in a circumferential direction of the ceramic piezoelectric element are applied between the electrodes. When the height and radius of the cylindrical ceramic piezoelectric element satisfy a predetermined relational expression and the AC voltages having the resonant frequencies described above are applied, the ultrasonic drive device serves as a rotary actuator for obtaining rotating operation in a very small space.

As disclosed in Patent Document 1, however, in order that the ultrasonic drive device including the ceramic piezoelectric element generates rotating operation as a rotary actuator, the height and radius of the cylindrical ceramic piezoelectric element must strictly satisfy the predetermined relation (expression), and the AC voltages to be applied must have frequencies for accurately producing resonances in both the height direction and the circumferential direction. In other words, the ultrasonic drive device disclosed in Patent Document 1 serves as a rotary actuator only in the case of satisfying the severe conditions.

The present invention has been devised to solve the foregoing problems, and an object thereof is to provide an actuator which can be driven with a simple configuration and by simple control and does not require severe operating conditions.

Means for Solving the Problem

An actuator according to the present disclosure comprising: a thin film made of a shear piezoelectric material; a first electrode formed on a first main surface of the thin film; and a second electrode formed on a second main surface of the thin film, wherein driving force is generated on at least one end edge of the thin film by applying a predetermined AC voltage between the first electrode and the second electrode, and the predetermined AC voltage has a frequency displaced by a predetermined value from a resonant frequency of a standing wave in longitudinal waves generated on the thin film.

The thin film is preferably made of polymer film. Furthermore, the shear piezoelectric material is preferably a piezoelectric polylactate material.

Effects of the Invention

According to the present invention, it is possible to realize an actuator which can be driven with a simple general configuration and by simple control and does not require severe operating conditions.

BRIEF DESCRIPTION OF DRAWINGS

FIGS. 2A to 2C are views for schematically illustrating the manufacture of the cylindrical unit of the rotary actuator according to the first embodiment.

MODE FOR CARRYING OUT THE INVENTION

With reference to the drawings, hereinafter, description will be given of preferred embodiments of the present invention.

[First Embodiment]

1. General Configuration

Figure 1A:
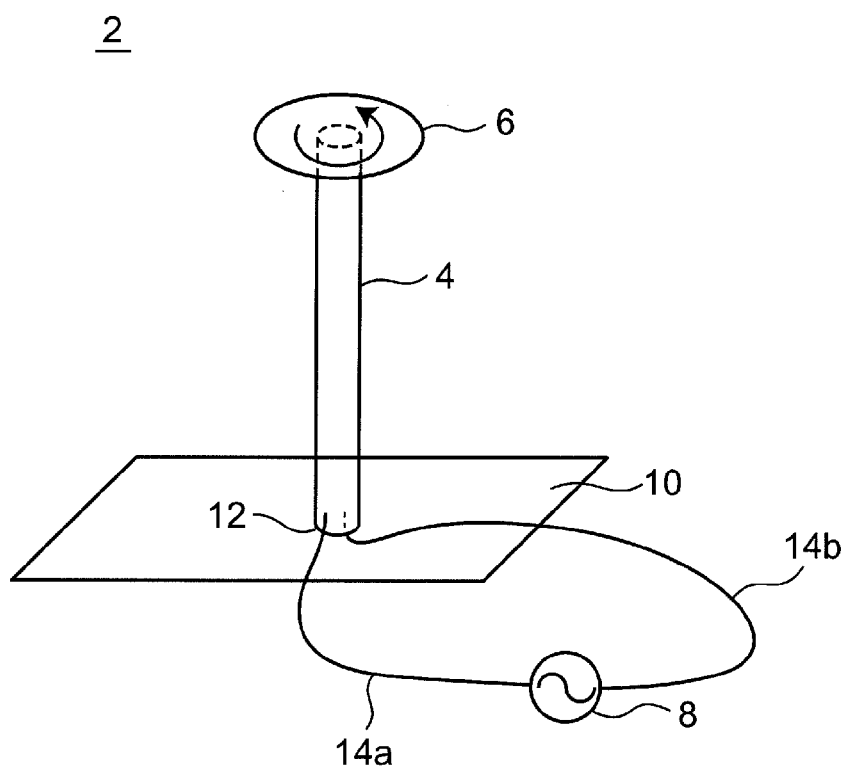
FIG. 1A is a perspective view illustrating a general configuration of a rotary actuator according to a first embodiment of the present invention.
Figure 1B:
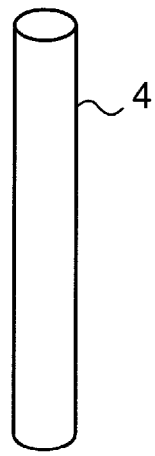
FIG. 1B is a perspective view illustrating a cylindrical unit forming the rotary actuator according to the first embodiment of the present invention.
Figure 1C:
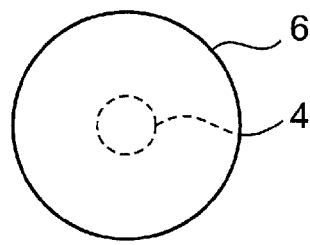
FIG. 1C is a plan view illustrating a rotatable body receiving rotating action.

FIGS. 1A to 1C illustrate a general configuration of a rotary actuator 2 according to a first embodiment of the present invention. Specifically, FIG. 1A is a perspective view illustrating the general configuration of the rotary actuator 2 according to the first embodiment, FIG. 1B is a perspective view illustrating a cylindrical unit 4 forming the rotary actuator 2 according to the first embodiment, and FIG. 1C is a plan view illustrating a rotatable body 6 receiving rotating action.

The rotary actuator 2 is configured with the cylindrical unit 4. The cylindrical unit 4 is made of a polymer film which is a thin film as will be described later. A first electrode is formed in such a manner that electroconductive metal is thinly deposited on an entire outer surface of the cylindrical unit, and a second electrode is formed in such a manner that electroconductive metal is thinly deposited on an entire inner surface of the cylindrical unit. The first electrode and the second electrode are connected to an AC power supply 8 via conductive wires 14a and 14b, respectively. According to this configuration, an AC voltage is applied to the polymer film by the first electrode and the second electrode in the cylindrical unit 4.

The cylindrical unit 4 has one open end 12 coming into contact with a horizontal plane 10, and is secured to the horizontal plane 10 so as to be erected in a vertical direction to the horizontal plane 10. The vertically erected cylindrical unit 4 has the other open end on which the rotatable body 6 receiving torque is mounted (see FIG. 1C). The rotatable body 6 preferably has a circular shape, a semi-spherical shape or a spherical shape, for example. Moreover, the rotatable body 6 is mounted in such a manner that a center point thereof is aligned with a center line of the cylindrical unit 4, which leads to more excellent rotating performance.

It was verified that in the rotary actuator 2 illustrated in FIG. 1A, when the AC power supply 8 applies an AC voltage having a predetermined frequency to the cylindrical unit 4, the rotatable body 6 mounted on the upper end of the cylindrical unit 4 rotates.

2. Method for Manufacturing Rotary Actuator

Description will be given of a method for manufacturing the rotary actuator 2 according to the first embodiment. FIGS. 2A to 2C schematically illustrate the method for manufacturing the cylindrical unit 4 of the rotary actuator 2 according to the first embodiment. The cylindrical unit 4 of the rotary actuator 2 was made of a polymer film which is a thin film made of piezoelectric polylactate and the like and having shear piezoelectricity (FIG. 2A). The polymer film 16 has dimensions of 35 μm in thickness, 10 cm in height and 1 cm in diameter when being formed into a cylindrical shape.

Electrodes 18a and 18b are formed in such a manner that electroconductive metal is thinly deposited on two main surfaces of the polymer film 16 (see FIGS. 2B1, 2B2). FIG. 2B1 illustrates the state that the electrode 18a is formed on one main surface (outer surface) of the polymer film 16, and FIG. 2B2 illustrates the state that the electrode 18b is formed on the other main surface (inner surface) of the polymer film 16. As described above, the electrodes are formed on the two main surfaces of the polymer film 16. The first conductive wire 14a is connected to the first electrode 18a formed on one main surface of the polymer film 16 in order to connect the first electrode 18a to the AC power supply 8, and the second conductive wire 14b is connected to the second electrode 18b formed on the other main surface of the polymer film 16 in order to connect the second electrode 18b to the AC power supply 8.

As illustrated in FIG. 2C, the polymer film 20 having the electrodes formed thereon is formed into a cylindrical shape, so that the cylindrical unit 4 is formed.

Herein, the inventor of the present invention has verified that the rotatable body rotates at 2.5 Hz when a 350-V AC voltage having a frequency of 5.25 kHz is applied to the cylindrical actuator (cylindrical unit height: 10 cm, cylindrical unit diameter: 1 cm, polymer film thickness: 35 μm) formed as described above.

3. Operating Principle

Description will be given of the operating principle of the rotary actuator 2. As described above, the polymer film 16 has the thickness of 35 μm, the height (h in FIG. 3A) of 10 cm, and a width (t in FIG. 3E) to be set such that a diameter when being formed into the cylindrical shape is 1 μm.

It is considered that torque is generated from the rotary actuator 2 because a pseudo-Rayleigh wave is generated on the upper end opening of the cylindrical unit 4.

Figure 3A:
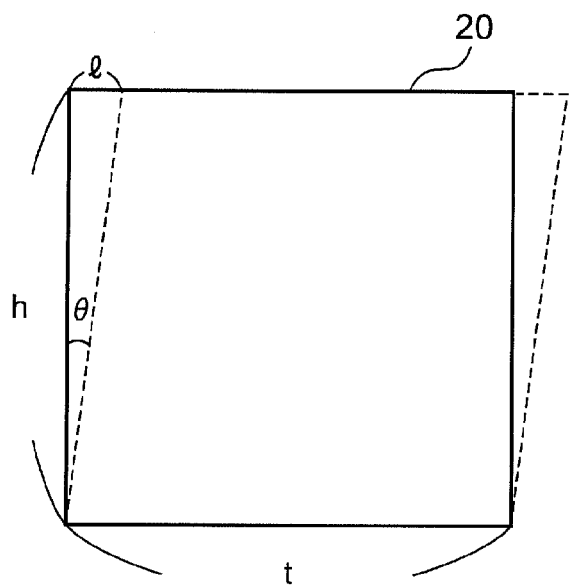
FIG. 3A is a view illustrating shear occurring when a voltage V is applied to a polylactate polymer film including electrodes formed on front and rear surfaces thereof and having shear piezoelectricity.

When an AC voltage is applied to the piezoelectric polylactate polymer film 16, (1) a shear wave is generated by piezoelectric action on the polymer film 16. FIG. 3A illustrates shear occurring when a voltage V is applied to the piezoelectric polylactate polymer film 20 including the electrodes formed on the front and rear surfaces thereof. The application of the voltage V causes shear (displacement) l, and a shear angle (displacement angle) at this time is represented by "θ". Herein, it is apparent that when a voltage to be applied is the AC voltage, the displacement l corresponds to a shear wave.

Figure 3B:
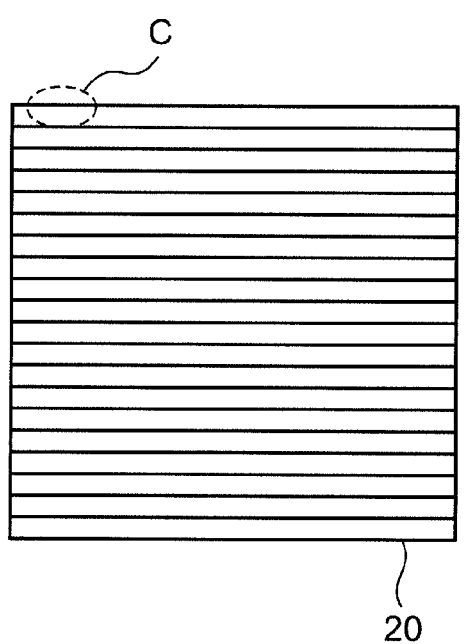
FIG. 3B is a view schematically illustrating a longitudinal wave (compression wave) to be generated on the piezoelectric polylactate polymer film including the electrodes formed on the front and rear surfaces thereof when an AC voltage is applied to the polymer film.

Moreover, when the AC voltage is applied to the polymer film 16, (2) a longitudinal wave (standing wave) resonating with the frequency of the AC voltage is generated on the polymer film 16. FIG. 3B schematically illustrates the longitudinal wave generated on the piezoelectric polylactate polymer film 20 including the electrodes formed on the two main surfaces thereof when the AC voltage is applied to the polymer film 20.

A very small Rayleigh wave is generated on the upper end opening of the cylindrical unit 4 by integration of (1) the shear wave and (2) the longitudinal wave.

An AC voltage to be applied in this embodiment is not an AC voltage having a frequency (resonant frequency) completely resonating with a longitudinal wave which is a standing wave, but an AC voltage having a frequency slightly displaced from the resonant frequency.

It is considered that in the case where the frequency of the applied AC voltage is the resonant frequency, complete resonance (longitudinal wave) is induced on the polymer film 20, and a symmetrical Rayleigh wave is generated on the end edge of the polymer film 20 by the integration of the shear wave and the longitudinal wave under the complete resonance. In contrast to this, it is considered that in the case where the frequency of the applied AC voltage is "the frequency slightly displaced from the resonant frequency", resonance slightly displaced from the complete resonance is induced on the polymer film 20, and a slightly asymmetrical pseudo-Rayleigh wave is generated on the end edge of the polymer film 20 by the integration of the shear wave and the longitudinal wave under the resonance slightly displaced from the complete resonance. As the result, it is considered that driving force in a predetermined direction is generated on the end edge of the polymer film 20 by this slightly asymmetrical pseudo-Rayleigh wave (see FIG. 4B). In other words, the AC voltage having the frequency slightly displaced from the resonant frequency is applied such that the driving force in the predetermined direction is generated on the end edge of the polymer film 20.

Specifically, an AC voltage having a frequency (fp+Δf) displaced from the resonant frequency (fp) to a positive side by a predetermined value (Δf) and an AC voltage having a frequency (fp−Δf) displaced from the resonant frequency (fp) to a negative side by the predetermined value (Δf) are applied as a driving voltage to the polymer film 20 in this embodiment. The application of both the driving voltages results in the generation of the pseudo-Rayleigh wave. The direction of driving force generated by the application of the AC voltage having the frequency "fp−Δf" is opposite to the direction of driving force generated by the application of the AC voltage having the frequency "fp+Δf". The reason therefor is considered as follows. That is, the asymmetry of the generated pseudo-Rayleigh wave becomes opposite to the asymmetry of the pseudo-Rayleigh wave generated when the AC voltage having the frequency "fp+Δf" is applied. Accordingly, the direction of driving force can be changed by switching the driving frequency between "fp+Δf" and "fp−Δf".

Figure 3C:
FIG. 3C is a view schematically illustrating a surface wave (pseudo-Rayleigh wave) generated in a region shown with a dotted line C in FIG. 3B.

FIG. 3C schematically illustrates the pseudo-Rayleigh wave generated in a region shown with a dotted line C in FIG. 3B. It is considered that the pseudo-Rayleigh wave shown with an arrow mark in FIG. 3C acts on a body to be mounted on the upper end opening of the cylindrical unit 4 such that the body is moved from the left to the right in the figure. That is, it is considered that this pseudo-Rayleigh wave rotates the rotatable body 6 mounted on the upper end opening of the cylindrical unit 4 at a certain angular velocity.

Next, studies will be made on conditions on which the pseudo-Rayleigh wave is generated.

3-1. Longitudinal Wave Resonance

First, description will be given of the longitudinal wave resonance. Piezoelectric polylactate to be used for a polymer film has the following physical properties, for example.

Density $\rho = 1.14 \times 10^3$ kg/m$^3$

Young's modulus $Y = 2.07$ GPa

Herein, a velocity v of a longitudinal wave is obtained from Formula 1 to be described below.

$$v = \sqrt{\frac{Y}{\rho}} = 1347 \text{ m/s} \qquad [\text{Formula 1}]$$

In a circumference (0.01 m×2π) relative to a radius of 1 cm, when a standing wave of λ/2 (in longitudinal waves) is generated, the frequency of the AC power supply and the longitudinal wave are resonated. Herein, λ represents a wavelength, and a relation of λ=0.01 m×2π×2=6.28 cm is satisfied in this case. Herein, since a relation of v=λ×f (f: frequency) is satisfied, the following formula (Formula 2) is established.

$$1347 = 0.01 \times 2\pi \times 2 \times f \qquad [\text{Formula 2}]$$

A relation of f≈10 kHz is derived from Formula 2. Accordingly, it is considered that when an AC voltage having a frequency of 10 kHz is applied, longitudinal wave resonance occurs at the cylindrical unit 4 of the rotary actuator 2.

3-2. Shear Wave

Next, description will be given of a "shear wave" to be generated by the piezoelectricity of the polymer film 16. The piezoelectric polylactate polymer film 16 has the following piezoelectric modulus d, for example.

Piezoelectric modulus d=10 pC (picofarad)/N (newton)

Herein, a shear angle (displacement angle) θ is obtained from Formula 3 to be described below.

$$\theta = dE \qquad [\text{Formula 3}]$$

Herein, E represents a magnitude of an electric field. When a voltage to be applied is 350 V and a thickness of the polymer film (i.e., a distance between the electrodes) is 35 μm, a value of θ is obtained from Formula 4 to be described below.

$$\theta = 10 \times 10^{-12} \times 350 \times \frac{1}{35 \times 10^{-6}} = 10^{-4} \qquad [\text{Formula 4}]$$

Since a relation of displacement l=h×θ is satisfied as illustrated in FIG. 3A, the displacement l is obtained from Formula 5 to be described below.

$$l = 0.1 \times 10^{-4} = 10 (\mu m) \qquad [\text{Formula 5}]$$

3-3. Pseudo-Rayleigh Wave

Figure 4A:
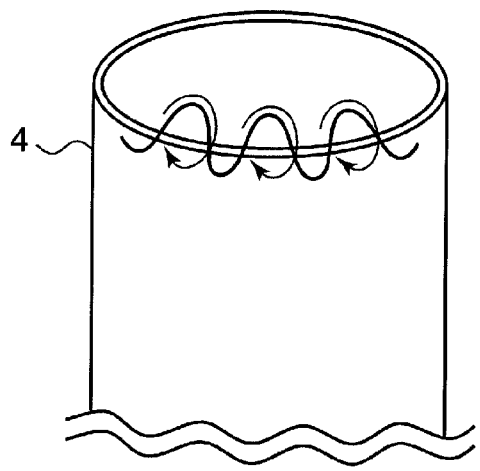
FIG. 4A is a view schematically illustrating a pseudo-Rayleigh wave generated on an upper end of the cylindrical unit.

It is considered that in Chapters [3-1] and [3-2], a Rayleigh wave is generated on the upper end opening of the cylindrical unit 4 in a frequency of about 10 kHz by integration of a resonating longitudinal wave having a wavelength (λ) of about 0.06 m and a shear wave having a displacement of about $10^5$ m. As described above, this Rayleigh wave is a pseudo-Rayleigh wave. FIG. 4A schematically illustrates a pseudo-Rayleigh wave generated on the upper end opening of the cylindrical unit 4.

Since the 10 kHz AC voltage is applied and the displacement l of the shear wave is $10^{-5}$ m, a velocity v of movement by the pseudo-Rayleigh wave is obtained from Formula 6 to be described below.

$$v = f \times l = 10 \times 10^3 \times 10 \times 10^{-6} 10^{-1} \text{ m/s} \qquad [\text{Formula 6}]$$

Figure 4B:
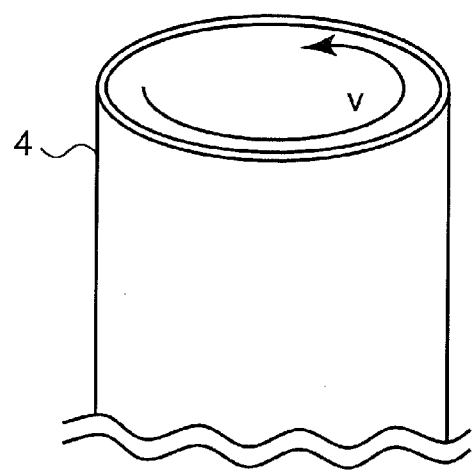
FIG. 4B is a view illustrating a velocity v of movement by the pseudo-Rayleigh wave.

FIG. 4B illustrates the velocity v of movement by the pseudo-Rayleigh wave.

Herein, a time required for the velocity v of movement by the pseudo-Rayleigh wave to completely revolve around the upper end of the cylindrical unit 4 (i.e., a cycle) is obtained from Formula 7 to be described below, and a revolution per unit time is obtained from Formula 8 to be described below.

$$\frac{2\pi \times 0.01}{10^{-1}} = 0.628 \qquad [\text{Formula 7}]$$

$$\frac{10^{-1}}{2\pi \times 0.01} = \frac{1}{0.628} = 1.6 \qquad [\text{Formula 8}]$$

3-4. Conclusion

As described above, according to the first embodiment, the actuator 2 including the cylindrical unit 4 configured with the polymer film 20 on which metal is deposited for forming electrodes in order to apply an AC voltage may serve as a torque source for rotating the rotatable body 6 mounted on the upper end of the cylindrical unit 4.

[Second Embodiment]

2.1. Configuration in Second Embodiment

Figure 5A:
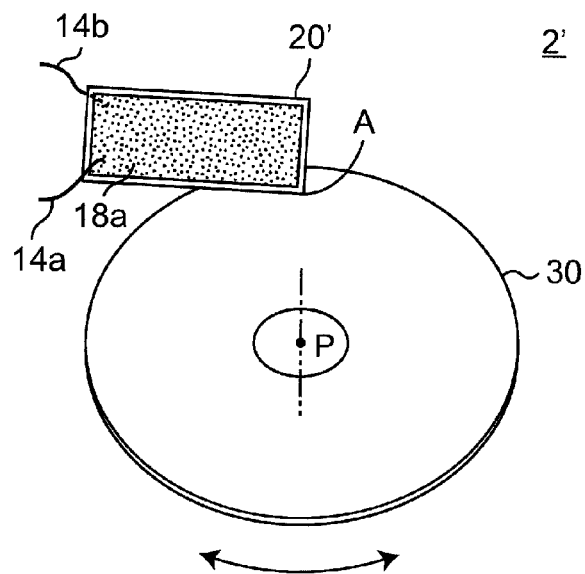
FIG. 5A is a perspective view illustrating a general configuration of an actuator according to a second embodiment of the present invention.
Figure 5B:
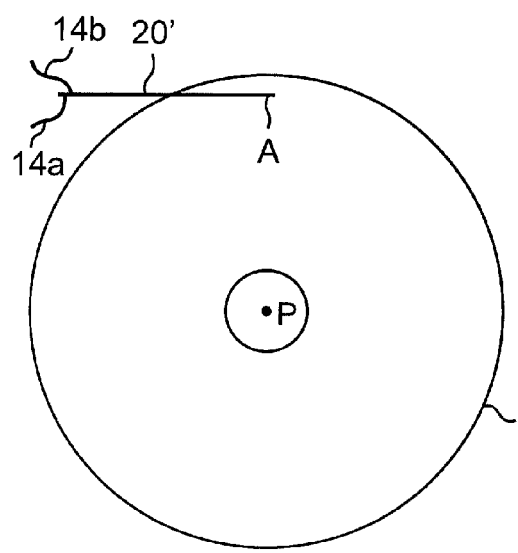
FIG. 5B is a plan view illustrating the general configuration of the actuator according to the second embodiment of the present invention.
Figure 5C:
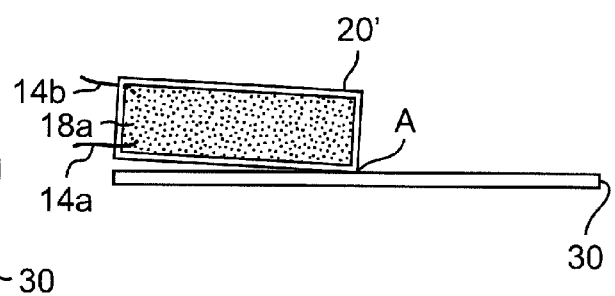
FIG. 5C is a front view illustrating the general configuration of the actuator according to the second embodiment of the present invention.

The form of the actuator according to the present invention is not limited to that described in the first embodiment. That is, the polymer film 20, shown in the first embodiment, on which metal is deposited for forming electrodes can be used as it is in a flat plate shape, for example. FIGS. 5A to 5C illustrate an actuator 2' according to a second embodiment of the present invention, and the actuator 2' is configured with a flat plate-shaped polymer film 20' on which metal is deposited for forming electrodes.

FIG. 5A illustrates, as a target to be driven, a rotary table 30 having a diameter of about 10 cm and smoothly rotating about a center axis P. FIG. 5B is a plan view in which the polymer film 20 and rotary table 30 illustrated in FIG. 5A are seen from above. FIG. 5C is a view in which the polymer film 20 and rotary table 30 illustrated in FIG. 5A are seen from the lateral side. As illustrated in FIG. 5A, the flat plate-shaped polymer film 20' on which metal is deposited for forming electrodes is in contact with the rotary table 30 at a point A in the vicinity of a circumferential end of the rotary table 30 (see FIG. 5C). As illustrated in FIGS. 5A and 5B, the flat plate-shaped polymer film 20' is mounted such that the flat plate portion is orthogonal to the plane of the rotary table 30 and is directed to a tangential direction of a circumference of the rotary table 30. The point A at which the polymer film 20' comes into contact with the rotary table 30 is provided on a radius of the rotary table 30 which is orthogonal to the plane of the polymer film 20'.

2.2. Operation of Actuator in Second Embodiment

As in the first embodiment, when an AC voltage having a frequency slightly displaced from a resonant frequency is applied to the actuator 2' illustrated in FIGS. 5A to 5C, that is, the polymer film 20' via conductive wires 14a and 14b, a pseudo-Rayleigh wave is generated on a lower end edge of the polymer film 20'. As described in the first embodiment, this pseudo-Rayleigh wave has driving force. This driving force propagates to the rotary table 30 through the point A, so that the rotary table 30 rotates with this driving force.

As in the first embodiment, moreover, also in the actuator 2' according to the second embodiment, it is possible to change a direction of driving force of the polymer film 20' by switching a driving frequency between "fp+Δf" and "fp−Δf" with regard to an AC voltage to be applied.

2.3. Conclusion

As described above, according to the second embodiment, the actuator 2' including the flat plate-shaped polymer film 20' on which metal is deposited for forming electrodes in order to apply an AC voltage may serve as a driving force source for rotating the rotary table 30. Herein, the inventor of the present invention has realized 600 to 700 rpm (revolutions per minute) of the rotary table 30 having a weight of about 300 g with the polymer film 20' having a length of about 5 cm and a width of about 2 cm. The actuator 2' according to this embodiment can be applied to a rotary table in a hard disc drive, for example.

[Third Embodiment]

3.1. Configuration in Third Embodiment

Figure 6A:
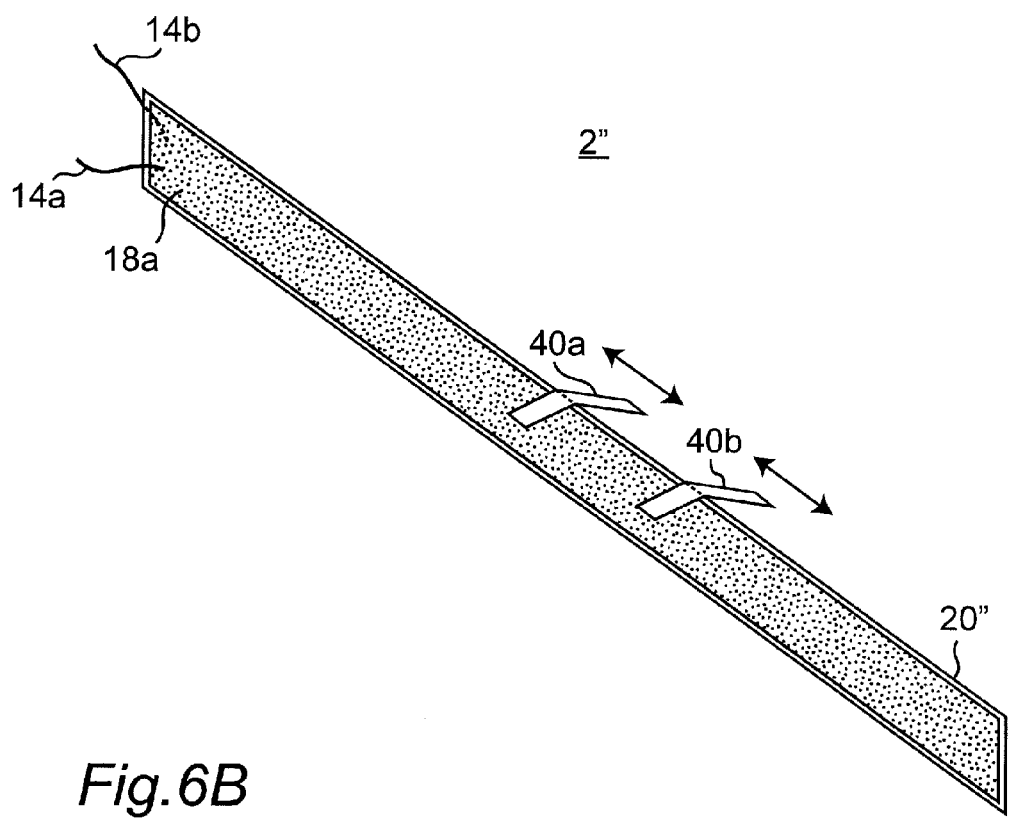
FIG. 6A is a perspective view illustrating a general configuration of an actuator according to a third embodiment of the present invention.
Figure 6B:
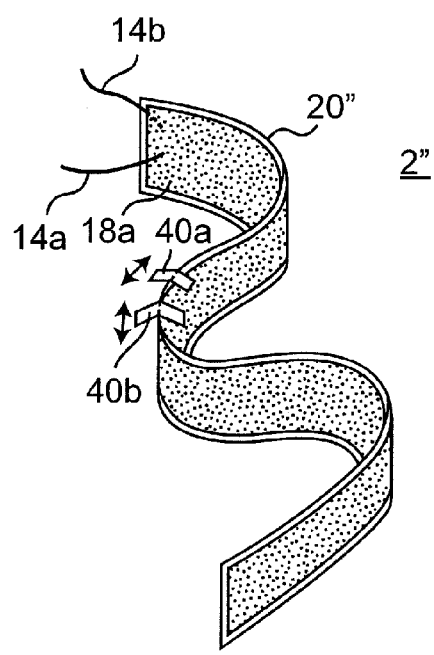
FIG. 6B is a perspective view illustrating a general configuration of another actuator according to the third embodiment of the present invention.
Figures 7A, 7B, 7C:
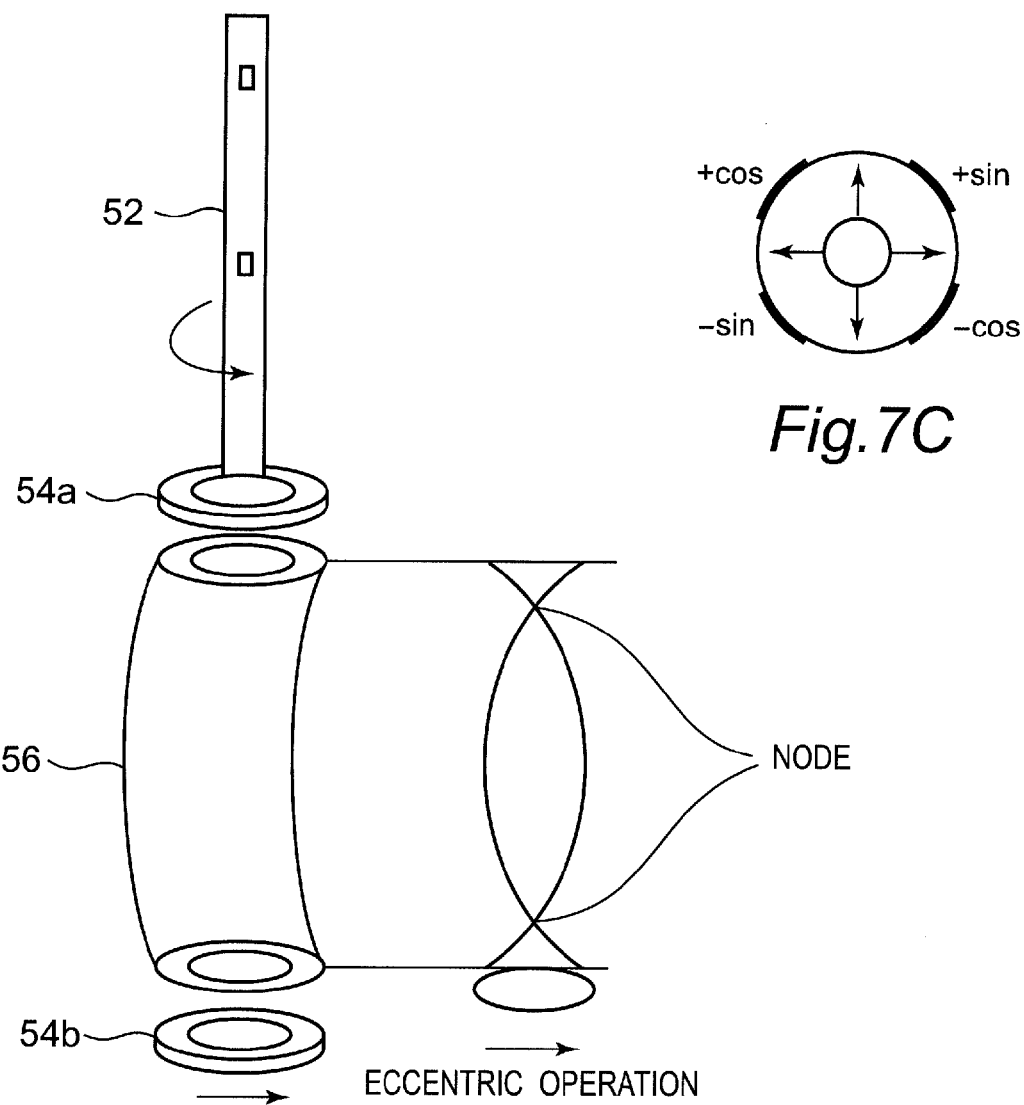
FIGS. 7A to 7C are views illustrating a configuration of a conventional PZT tubular motor.

In the actuator 2' according to the second embodiment, one point on the flat plate-shaped polymer film 20' is used as a point of application of force. In this embodiment, description will be given of a configuration that one side of a flat plate-shaped polymer film is entirely used as a point of application of force. FIGS. 6A and 6B illustrate an actuator 2" according to the third embodiment of the present invention.

FIG. 6A illustrates a state that a polymer film 20" on which metal is deposited for forming electrodes is erected in a vertical direction. That is, the polymer film 20" is disposed in a straight form with one of longer sides directed downward. As illustrated in FIG. 6B, herein, the polymer film 20" may be disposed in not only the straight form, but also a corrugated form.

As illustrated in FIGS. 6A and 6B, movable bodies 40a and 40b are mounted on the upper end edge of the longer side of the actuator 2". Each of the movable bodies 40a and 40b has such a light weight as to be mounted on the upper end edge of the longer side of the polymer film 20", and is made of paper, light-weight plastic, or the like. As illustrated in FIGS. 6A and 6B, each of the movable bodies 40a, 40b is bent at the center thereof and two ends thereof are evenly suspended so as to keep the balance on the upper end edge of the longer side of the polymer film 20".

3.2. Operation of Actuator in Third Embodiment

As in the first embodiment, when an AC voltage having a frequency slightly displaced from a resonant frequency is applied to the polymer film 20" in the third embodiment illustrated in FIGS. 6A and 6B via conductive wires 14a and 14b, a pseudo-Rayleigh wave is generated on the upper end edge of the polymer film 20". As described in the first embodiment, this pseudo-Rayleigh wave has driving force. This driving force propagates to the movable bodies 40a and 40b through contact portions between the upper end edge of the polymer film 20" and the movable bodies 40a and 40b, so that the movable bodies 40a and 40b move straight ahead with this driving force.

As in the first and second embodiments, also in the actuator 2" according to the third embodiment, it is possible to change the direction of the driving force of the polymer film 20" by switching a driving frequency between "fp+Δf" and "fp−Δf" with regard to an AC voltage to be applied. In other words, it is possible to change the direction of movable bodies 40a and 40b moving straight ahead, by switching the driving frequency between "fp+Δf" and "fp−Δf".

Accordingly, the movable body 40a and the movable body 40b move straight ahead on the upper end edge of the longer side of the polymer film 20" with a certain spacing always kept therebetween. By switching the driving frequency between "fp+Δf" and "fp−Δf" with regard to the AC voltage to be applied, the movable body 40a and the movable body 40b move straight ahead in the reverse direction with a certain spacing always kept therebetween.

3.3. Conclusion

As described above, according to the third embodiment, the actuator 2" including the flat plate-shaped polymer film 20" on which metal is deposited for forming electrodes in order to apply an AC voltage may serve as a driving force source allowing the movable bodies 40a and 40b mounted on the upper end edge of the longer side to move straight ahead on the upper end edge of the longer side.

[Other Embodiments]

The idea of the present invention is not limited to the description in the first to third embodiments. In the first to third embodiments, the polymer film is made of polylactate. However, the actuator according to the present invention may be made of other shear piezoelectric polymer film, for example, polyvinylidene fluoride or a copolymer thereof. That is, the material for the polymer film is not particularly limited as long as it causes shear by the piezoelectricity irrespective of a direct manner or an indirect manner. Moreover, polymer film is not necessarily used as long as a material causing "shear" by the piezoelectricity is used. For example, the actuator may be made of other material such as ceramic.

In the first embodiment, the cylindrical unit 4 has a circular lateral section, but may have an oval lateral section, for example. Moreover, the rotary actuator may be configured with a plurality of cylindrical units arranged concentrically. Herein, duplex, triplex or more cylindrical units are arranged.

The actuator may be configured with the plurality of piezoelectric polylactate polymer films 20 each having front and rear surfaces on which electrodes are formed, in such a manner that these polymer films are erected and appropriately arranged. The actuator configured as described above allows movable bodies mounted on the upper end edges of the respective polymer films to move in various directions.

The dimensions, such as the thickness, height and width, of the polymer film 16 described in the first to third embodiments are merely one example, and are not intended to be limited to values described in the first to third embodiments.

Description Of Reference Characters

2 Rotary actuator
2', 2" Actuator
4 Cylindrical unit
6 Rotatable body
8 AC power supply
10 Horizontal plane
14a, 14b Conductive wire
16 Polymer film
18a First electrode
18b Second electrode
20, 20', 20" Polymer film on which metal is deposited for forming electrodes
30 Rotary table
40a, 40b Movable body.

What is claimed is:

1. An actuator comprising:
   a thin film made of a shear piezoelectric material;
   a first electrode formed on a first main surface of the thin film; and
   a second electrode formed on a second main surface of the thin film, wherein
   a driving force is generated on at least one end edge of the thin film by applying a predetermined AC voltage, which has a predetermined frequency displaced by a predetermined value from a resonant frequency of a standing wave in longitudinal waves generated on the thin film, between the first electrode and the second electrode.

2. The actuator according to claim 1, wherein
   the thin film is made of polymer film.

3. The actuator according to claim 2, wherein
   the shear piezoelectric material is a piezoelectric polylactate material.

4. The actuator according to claim 1, wherein
   the thin film is formed into a cylindrical shape, and
   torque is generated on one open end of the cylindrical shaped thin film in a state in which the predetermined AC voltage is applied between the first electrode and the second electrode.

5. The actuator according to claim 1, wherein
   a movable body is in contact with one point of the actuator, and the driving force for rotating the movable body in a state in which the predetermined AC voltage is applied between the first electrode and the second electrode is generated at a contact portion between the movable body and the one point of the actuator.

6. The actuator according to claim 1, wherein
   a movable body is mounted on one side of the actuator that is disposed linearly, and the driving force is generated so as to allow the movable body to move along the one side of the actuator in a state in which the predetermined AC voltage is applied between the first electrode and the second electrode.

7. A method for driving an actuator including a thin film made of a shear piezoelectric material, a first electrode formed on a first main surface of the thin film, and a second electrode formed on a second main surface of the thin film, the method comprising:
   applying a predetermined AC voltage, which has a predetermined frequency displaced by a predetermined value from a resonant frequency of a standing wave in longitudinal waves generated on the thin film, between the first electrode and the second electrode so as to generate a driving force on at least one end edge of the thin film.

8. The method according to claim 7, further comprising:
   changing a direction of the driving force by switching the predetermined frequency of the predetermined AC voltage between a first driving frequency displaced by the predetermined value from the resonant frequency to a positive side and a second driving frequency displaced by the predetermined value from the resonant frequency to a negative side.

* * * * *